US012695432B2

(12) United States Patent
Nuzum et al.

(10) Patent No.: US 12,695,432 B2
(45) Date of Patent: Jul. 28, 2026

(54) POWER AMPLIFIER SYSTEMS WITH FREQUENCY RESPONSE COMPENSATION

(71) Applicant: Skyworks Solutions, Inc., Irvine, CA (US)

(72) Inventors: Nathan Lucas Nuzum, Quasqueton, IA (US); Curtis Lee Mayberry, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 489 days.

(21) Appl. No.: 18/131,527

(22) Filed: Apr. 6, 2023

(65) Prior Publication Data

US 2023/0344393 A1 Oct. 26, 2023

Related U.S. Application Data

(60) Provisional application No. 63/329,247, filed on Apr. 8, 2022, provisional application No. 63/329,236, filed on Apr. 8, 2022.

(51) Int. Cl.
*H03F 3/04* (2006.01)
*H03F 1/02* (2006.01)
(Continued)

(52) U.S. Cl.
CPC ........... *H03F 3/213* (2013.01); *H03F 1/0233* (2013.01); *H03F 1/565* (2013.01); *H03F 3/245* (2013.01);
(Continued)

(58) Field of Classification Search
CPC ........ H03F 3/213; H03F 1/0233; H03F 1/565; H03F 3/245; H03F 2200/06;
(Continued)

(56) References Cited

U.S. PATENT DOCUMENTS 5,477,188 A * 12/1995 Chawla ................... H03F 3/604
330/269
8,452,243 B2 5/2013 Prikhodko et al.
(Continued)

FOREIGN PATENT DOCUMENTS

CN 106982098 A 7/2017
KR 10-2014-0056027 5/2014
(Continued)

OTHER PUBLICATIONS

International Search Report and Written Opinion in application No. PCT/US2023/073366, mailed on Jan. 2, 2024, in 8 pages.

*Primary Examiner* — Khanh V Nguyen
(74) *Attorney, Agent, or Firm* — VIA LLP

(57) ABSTRACT

A power amplification system is provided comprising: a power amplifier circuit, the power amplifier circuit including a plurality of transistors; and a frequency response compensation circuit for providing a plurality of values of capacitance. The frequency response compensation circuit having at least one tuning capacitor. Each of the at least one tuning capacitors is coupled to a tuning switch for regulating the current path to and/or from the corresponding capacitor to control the value of the capacitance provided by the frequency response compensation circuit. The frequency response compensation circuit is coupled to at least two of the transistors of the power amplifier circuit. The frequency response compensation circuit is configured to reduce variation over frequency of a load impedance of the power amplification system. A wireless device comprising such a power amplification system is also provided. A wireless module comprising such a power amplification system is also provided.

20 Claims, 14 Drawing Sheets

(51) Int. Cl.

| | |
|---|---|
| *H03F 1/56* | (2006.01) |
| *H03F 3/191* | (2006.01) |
| *H03F 3/213* | (2006.01) |
| *H03F 3/24* | (2006.01) |

(52) U.S. Cl.

CPC ...... *H03F 2200/06* (2013.01); *H03F 2200/09* (2013.01); *H03F 2200/451* (2013.01)

(58) Field of Classification Search

CPC .......... H03F 2200/09; H03F 2200/451; H03F 2200/411; H03F 3/265; H03F 3/3098; H03F 1/22; H03F 2200/537; H03F 2200/541; H03F 3/195; H03F 2200/372; H03F 2200/294; H03F 3/45475; H03F 3/191; H03F 200/372; H03F 3/193; H03F 1/0222; H03F 2200/102; H03G 3/3042

USPC ................. 330/116, 117, 136, 301, 305, 306

See application file for complete search history.

(56) References Cited

U.S. PATENT DOCUMENTS

| | | | |
|---|---|---|---|
| 9,729,048 | B2 | 8/2017 | Crandall et al. |
| 10,411,660 | B1 * | 9/2019 | Ortiz ...................... H03F 3/195 |
| 10,483,843 | B2 | 11/2019 | Crandall et al. |
| 10,680,516 | B2 | 6/2020 | Crandall et al. |
| 11,901,867 | B2 * | 2/2024 | Honda ................... H03F 3/195 |
| 2009/0318093 | A1 | 12/2009 | Prikhodko et al. |
| 2010/0056201 | A1 | 3/2010 | Akamine et al. |
| 2011/0095826 | A1 | 4/2011 | Hadjichristos et al. |
| 2015/0130539 | A1 * | 5/2015 | Gorbachov ............. H03H 7/42 |
| | | | 330/252 |
| 2016/0036320 | A1 | 2/2016 | Crandall et al. |
| 2016/0036390 | A1 | 2/2016 | Lin et al. |
| 2017/0310213 | A1 | 10/2017 | Crandall et al. |
| 2017/0338781 | A1 * | 11/2017 | Lyalin ...................... H03F 3/26 |
| 2020/0119637 | A1 | 4/2020 | Crandall et al. |
| 2020/0137877 | A1 | 4/2020 | Mu et al. |
| 2022/0255508 | A1 | 8/2022 | Lehtola et al. |
| 2022/0385237 | A1 | 12/2022 | Lehtola et al. |
| 2022/0393654 | A1 | 12/2022 | Li et al. |
| 2023/0020495 | A1 * | 1/2023 | Lehtola .................. H03F 3/245 |
| 2023/0216457 | A1 | 7/2023 | Liu et al. |
| 2023/0344395 | A1 | 10/2023 | Nuzum et al. |

FOREIGN PATENT DOCUMENTS

| | | |
|---|---|---|
| KR | 10-2023-0011248 | 1/2023 |
| WO | 2011/127777 A1 | 10/2011 |

* cited by examiner

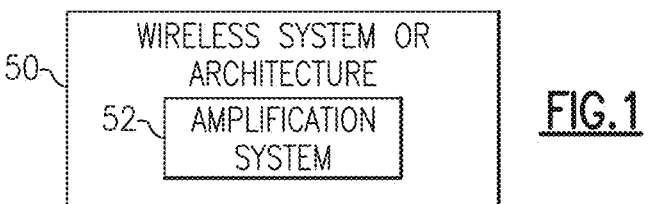
FIG.1
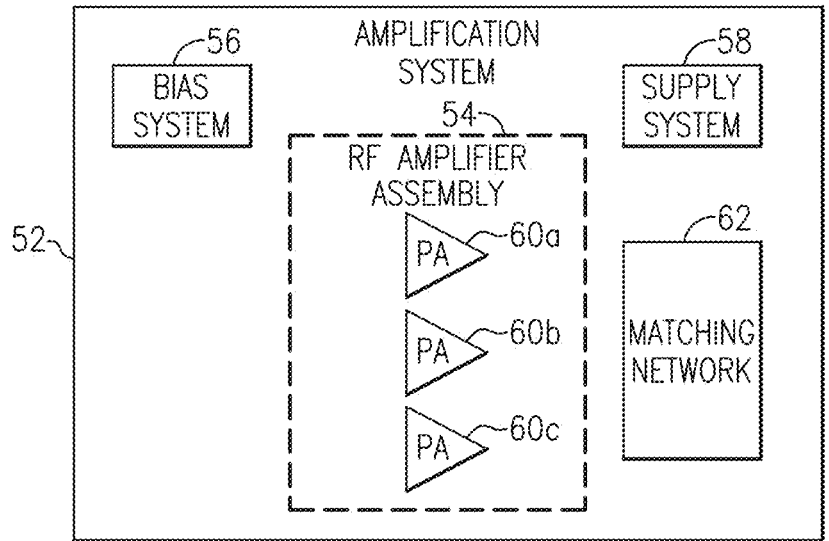
FIG.2
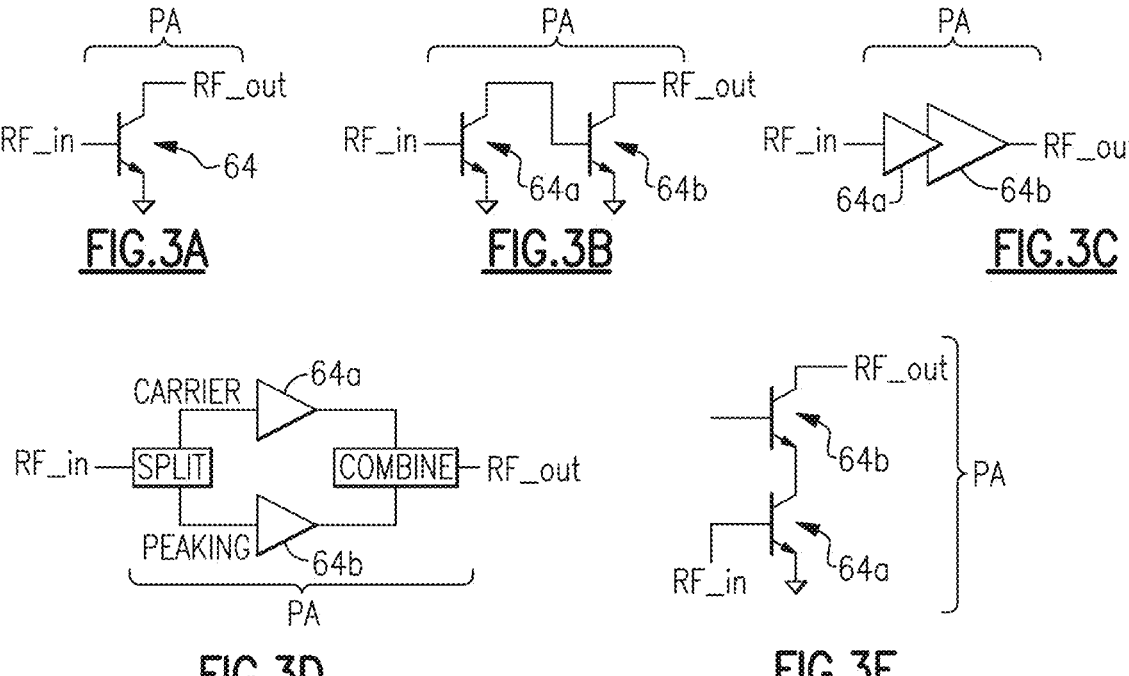
FIG.3A     FIG.3B     FIG.3C
FIG.3D     FIG.3E

WITH LOAD
SWITCHING

——— POWER CLASS 3
------------ POWER CLASS 2

POWER AMPLIFIER SYSTEMS WITH FREQUENCY RESPONSE COMPENSATION

INCORPORATION BY REFERENCE TO ANY PRIORITY APPLICATIONS

Any and all applications, if any, for which a foreign or domestic priority claim is identified in the Application Data Sheet of the present application are hereby incorporated by reference under 37 CFR 1.57.

FIELD OF THE INVENTION

The present disclosure generally relates to power amplifiers, and particularly to power amplifier systems for RF applications.

BACKGROUND OF THE INVENTION

Radio-frequency (RF) communications devices and systems may comprise or be connected to an antenna to transmit and receive signals. Such devices and systems may also comprise additional components and circuitry for processing signals transmitted and received via the antenna. For example, RF communications devices and systems using a cellular standard, a wireless local area network (WLAN) standard, and/or any other suitable communication standard may comprise or be connected to one or more power amplifier for amplifying a signal transmitted or received via the antenna.

Such a power amplifier may be a push-pull amplifier used for envelope tracking. While a push-pull amplifier can be implemented for a number of RF communication devices and systems, a need exists for a better amplification system design to improve various parameters, such as rejection of second harmonics, lower power supply rail capacitance, and power efficiency.

BRIEF SUMMARY OF THE INVENTION

The invention is defined by the claims. Optional features are detailed in the dependent claims.

According to a number of embodiments of a first aspect, a power amplification system is provided, the power amplification system comprising: a power amplifier circuit; an output power control circuit for providing a plurality of values of capacitance, and a balun coupled to the power amplifier circuit and to the output power control circuit. The output power control circuit comprises at least one load control capacitor. Each of the at least one load control capacitors is coupled to a load control switch for regulating the current path to and/or from the corresponding capacitor to control the value of the capacitance provided by the output power control circuit.

Optionally, the power amplifier circuit may a plurality of transistors.

Optionally, at least two of the transistors of the power amplifier circuit may be differential transistors.

Optionally, the power amplifier circuit may comprise a push-pull amplifier.

Optionally, the balun may comprise a first coil having a first end and a second end, the first end of the first coil being coupled to a first differential transistor and the second end of the first coil being coupled to a second differential transistor.

Optionally, the first end of the first coil may be coupled to a drain or a collector of the first differential transistor and the second end of the first coil may be coupled to a drain or a collector of the second differential transistor.

Optionally, the balun may comprise a second coil having a first end and a second end, the first end of the second coil being coupled to an RF output node and the second end of the second coil being coupled to a ground.

Optionally, the second end of the second coil may be coupled to the ground via one or more termination capacitors.

Optionally, at least one of the termination capacitors may be a surface-mount capacitor.

Optionally, the output power control circuit may be coupled with at least one of the termination capacitors.

Optionally, at least one of the load control capacitors and at least one of the termination capacitors may be connected in parallel.

Optionally, a capacitance of the balun may be dependent on one or more of: the value of the termination capacitor of the balun, the value of the capacitance provided by the output power control circuit, whether the termination capacitor and the output power control circuit is connected in parallel or in series, and whether the load control switch is on or off.

Optionally, the output power control circuit may provide low capacitance having a value close to zero when the load control switch is off.

Optionally, when the load control switch is off, the output power control circuit may not provide additional capacitance to the balun, and the power amplification system may have a load impedance value that leads to a lower output power.

Optionally, when the load control switch is on, the output power control circuit may provide additional capacitance to the balun, causing a load impedance value to decrease and output power of the power amplification system to increase to a higher output power.

Optionally, an output power of the power amplification system may meet Power Class 3 requirement, for example as specified by the 3GPP communication standard, when the load control switch is off.

Optionally, an output power of the power amplification system may meet Power Class 2 requirement, for example as specified by the 3GPP communication standard, when the load control switch is on.

Optionally, at least one of the load control capacitors may be a silicon-on-insulator capacitor.

Optionally, the output power control circuit may comprise a plurality of load control switches and a plurality of load control capacitors, each of the load control switches being coupled to one or more of the load control capacitors.

Optionally, the output power control circuit may be configured to provide a plurality of capacitor values alongside the low capacitance having a value close to zero by controlling one or more of the load control switches.

Optionally, the load control switch may be a FET switch.

Optionally, the power amplification system may comprise and/or be connected to one or more power amplifier components configured to provide at least one of advanced power tracking and envelop tracking.

Optionally, one or more part of the output power control circuit may be controlled by a CMOS control, the CMOS control being configured receive band and/or power mode controls over a MIPI digital interface.

Optionally, at least one of the transistors may be a heterojunction bipolar transistor.

Optionally, the power amplification system may comprise a frequency response compensation circuit for providing a plurality of values of capacitance. The frequency response compensation circuit comprises at least one tuning capacitor. Each of the at least one tuning capacitors is coupled to a switch for regulating the current path to and/or from the corresponding capacitor to control the value of the capacitance provided by the frequency response compensation circuit. The frequency response compensation circuit is coupled to at least two of the transistors of the power amplifier circuit. The frequency response compensation circuit is configured to reduce variation over frequency of a load impedance of the power amplification system.

According to a number of embodiments of the first aspect, a wireless device comprising: a memory; a user interface; a baseband sub-system; a transceiver; a power management component; and a power amplification system is also provided. The power amplification system comprises: a power amplifier circuit; an output power control circuit for providing a plurality of values of capacitance, and a balun coupled to the power amplifier circuit and to the output power control circuit. The output power control circuit comprises at least one load control capacitor. Each of the at least one load control capacitors is coupled to a load control switch for regulating the current path to and/or from the corresponding capacitor to control the value of the capacitance provided by the output power control circuit.

According to a number of embodiments of the first aspect, a wireless module comprising: a packaging substrate; one or more surface-mount devices; a duplexer assembly; a front-end power management integrated circuit; a match component; an antenna switch module; and a power amplifier assembly comprising a power amplification system is also provided. The power amplification system comprises: a power amplifier circuit; an output power control circuit for providing a plurality of values of capacitance, and a balun coupled to the power amplifier circuit and to the output power control circuit. The output power control circuit comprises at least one load control capacitor. Each of the at least one load control capacitors is coupled to a load control switch for regulating the current path to and/or from the corresponding capacitor to control the value of the capacitance provided by the output power control circuit.

According to a number of embodiments of a second aspect, a power amplification system comprising: a power amplifier circuit, the power amplifier circuit comprising a plurality of transistors; and a frequency response compensation circuit for providing a plurality of values of capacitance is provided. The frequency response compensation circuit comprises at least one tuning capacitor. Each of the at least one tuning capacitors is coupled to a tuning switch for regulating the current path to and/or from the corresponding capacitor to control the value of the capacitance provided by the frequency response compensation circuit. The frequency response compensation circuit is coupled to at least two of the transistors of the power amplifier circuit. The frequency response compensation circuit is configured to reduce variation over frequency of a load impedance of the power amplification system.

Optionally, at least two of the transistors of the power amplifier circuit may be differential transistors.

Optionally, the power amplifier circuit may comprise a push-pull amplifier.

Optionally, the power amplifier circuit may comprise at least one capacitor connected to at least two of the differential transistors.

Optionally, the capacitor connected to the differential transistors may be connected to the drains or collectors of two of the differential transistors.

Optionally, the frequency response compensation circuit may be coupled with at least one of the capacitors connected to at least two of the differential transistors.

Optionally, at least one of the tuning capacitors and at least one of the capacitor connected to at least two of the differential transistors are connected in parallel.

Optionally, a capacitance of the power amplifier circuit may be dependent on one or more of: the value of the capacitor connecting at least two of the differential transistors, the value of the capacitance provided by the frequency response compensation circuit, whether the capacitor connected to at least two of the differential transistors and the frequency response compensation circuit is connected in parallel or in series, and whether the tuning switch is on or off.

Optionally, the frequency response compensation circuit may provide low capacitance having a value close to zero when the tuning switch is off.

Optionally, when the tuning switch is off, the frequency response compensation circuit may not provide additional capacitance to the power amplifier circuit, and the power amplifier circuit may have an impedance value that is suitable for operation at a higher frequency band.

Optionally, when the tuning switch is on, the frequency response compensation circuit may provide additional capacitance to the power amplifier circuit that causes an on-resistance of the amplifier circuit at a lower frequency band to decrease and the PAE of the power amplification system at the lower frequency band to increase.

Optionally, the frequency response compensation circuit may comprise a plurality of tuning switches and a plurality of tuning capacitors, each of the tuning switches being coupled to one or more of the tuning capacitors.

Optionally, the frequency response compensation circuit may be configured to provide a plurality of capacitor values alongside the low capacitance having a value close to zero by controlling one or more of the tuning switches.

Optionally, the tuning switch may be a FET switch.

Optionally, the power amplification system may comprise and/or be connected to one or more power amplifier components configured to provide at least one of advanced power tracking and envelop tracking.

Optionally, at least one of the transistors may be a heterojunction bipolar transistor.

Optionally, one or more part of the frequency response compensation circuit may be controlled by a CMOS control, the CMOS control being configured receive band and/or power mode controls over a MIPI digital interface.

Optionally, the power amplification system may comprise an output power control circuit for providing a plurality of values of capacitance; and a balun coupled to the power amplifier circuit and to the output power control circuit. The output power control circuit comprises at least one load control capacitor. Each of the at least one load control capacitors is coupled to a load control switch for regulating the current path to and/or from the corresponding capacitor to control the value of the capacitance provided by the output power control circuit.

According to a number of embodiments of the second aspect, a wireless device comprising: a memory; a user interface; a baseband sub-system; a transceiver; a power management component; and a power amplification system is also provided. The power amplification system comprises: a power amplifier circuit, the power amplifier circuit comprising a plurality of transistors; and a frequency response compensation circuit for providing a plurality of values of capacitance is provided. The frequency response compensation circuit comprises at least one tuning capacitor. Each of the at least one tuning capacitors is coupled to a tuning switch for regulating the current path to and/or from the corresponding capacitor to control the value of the capacitance provided by the frequency response compensation circuit. The frequency response compensation circuit is coupled to at least two of the transistors of the power amplifier circuit. The frequency response compensation circuit is configured to reduce variation over frequency of a load impedance of the power amplification system.

According to a number of embodiments of the second aspect, a wireless module comprising: A packaging substrate; one or more surface-mount devices; a duplexer assembly; a front-end power management integrated circuit; a match component; an antenna switch module; and a power amplifier assembly comprising a power amplification system is also provided. The power amplification system comprises: a power amplifier circuit, the power amplifier circuit comprising a plurality of transistors; and a frequency response compensation circuit for providing a plurality of values of capacitance is provided. The frequency response compensation circuit comprises at least one tuning capacitor. Each of the at least one tuning capacitors is coupled to a tuning switch for regulating the current path to and/or from the corresponding capacitor to control the value of the capacitance provided by the frequency response compensation circuit. The frequency response compensation circuit is coupled to at least two of the transistors of the power amplifier circuit. The frequency response compensation circuit is configured to reduce variation over frequency of a load impedance of the power amplification system.

The first aspect and second aspect, and any optional features of either, may be combined into a common power amplifier. Such a power amplifier may provide PAE improvement by headroom reduction and PAE bandwidth enhancement across operational frequency.

BRIEF DESCRIPTION OF THE DRAWINGS

The invention will be described in more detail, by way of example, with reference to the accompanying drawings, in which:

FIG. 1 illustrates an example wireless system or architecture, according to an embodiment;

FIG. 2 illustrates an example amplification system comprising a radio frequency (RF) amplifier assembly having one or more power amplifiers, according to an embodiment;

FIG. 3A to 3E illustrates non-limiting examples of power amplifiers, in accordance with a number of embodiments;

DETAILED DESCRIPTION OF EMBODIMENTS

Figure 4:
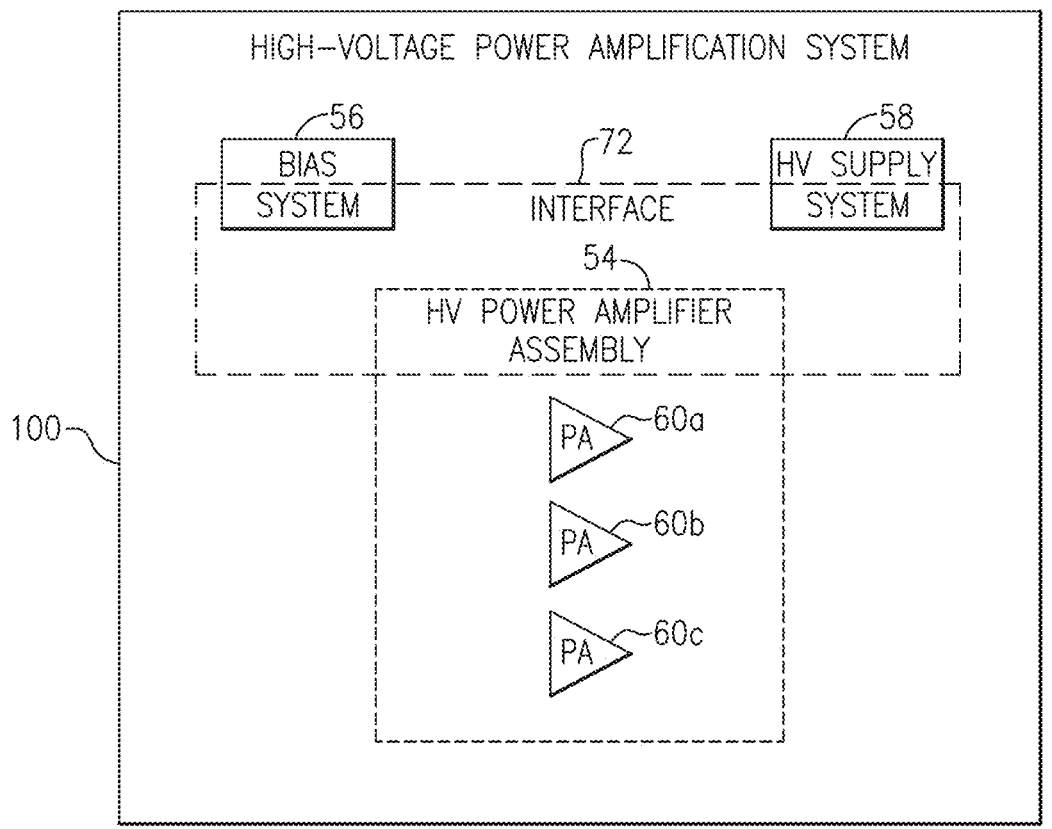
FIG. 4 illustrates an example amplification system implemented as a high-voltage (HV) power amplification system, according to an embodiment.

The embodiments disclosed herein generally relate to power amplifiers for RF communication applications. In accordance with some implementations, the present disclosure relates to a power amplification system. The power amplification system comprises a power amplifier circuit comprising a balun. Although the power amplification system illustrated in the examples of FIG. 5 and FIG. 6 comprises a push-pull amplifier comprising a transformer balun, the amplification system may comprise any other suitable type of power amplifier comprising any other suitable type of transformer balun. The power amplification system may also comprise an output power control circuit coupled to the balun, the output power control circuit being configured to provide a plurality of values of capacitance to control the output power of power amplifier. The power amplification system may also comprise a frequency response compensation circuit coupled to at least two of the transistors of the power amplifier circuit to reduce variation over frequency of a load impedance of the power amplification system. The power amplification system illustrated in the examples of FIG. 5 and FIG. 6 comprises both the output power control circuit and the frequency response compensation circuit. However, in other embodiments, The power amplification system may comprise only one of the output power control circuit and the frequency response compensation circuit.

Referring to FIG. 1, embodiments of the present invention may generally be implemented in a wireless system or architecture (50) having an amplification system (52). The amplification system (52) may be implemented as one or more devices, and such device(s) can be utilized in the wireless system/architecture (50). The wireless system/architecture (50) may be implemented in, for example, a portable wireless device. Examples of such a wireless device are described herein with respect to FIG. 12.

FIG. 2 shows that the amplification system (52) of FIG. 1 typically comprises a radio-frequency (RF) amplifier assembly (54) having one or more power amplifiers (PAs). In the example of FIG. 2, three PAs (60a-60c) are depicted as forming the RF amplifier assembly (54). It will be understood that other numbers of PA(s) can also be implemented. It will also be understood that one or more features of the present disclosure can also be implemented in RF amplifier assemblies having other types of RF amplifiers.

The RF amplifier assembly (54) may be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system (52) may be biased by a bias system (56). Further, supply voltages for the PAs may be provided by a supply system (58). Either or both of the bias system (56) and the supply system (58) may be included in the foregoing packaged module having the RF amplifier assembly (54).

The amplification system (52) may include a matching network (62). Such a matching network may be configured to provide input matching and/or output matching functionalities for the RF amplifier assembly (54).

For the purpose of description, it will be understood that each PA (60) of FIG. 2 may be implemented in a number of ways. FIG. 3A-3E show non-limiting examples of how such a PA may be configured. FIG. 3A shows an example amplifying transistor (64) that can form a part of PA, where an input RF signal (RF_in) is provided to a base of the transistor (64), and an amplified RF signal (RF_out) is output through a collector of the transistor (64). A plurality of such amplifying transistors may be included in a PA.

FIG. 3B shows an example PA having a plurality of amplifying transistors (e.g., 64a, 64 b) arranged in stages. An input RF signal (RF_in) is provided to a base of the first transistor (64a), and an amplified RF signal from the first transistor (64) a is output through its collector. The amplified RF signal from the first transistor (64a) is provided to a base of the second transistor (64b), and an amplified RF signal from the second transistor (64b) is output through its collector to thereby yield an output RF signal (RF_out) of the PA.

The foregoing example PA configuration of FIG. 3B can be depicted as two or more stages as shown in FIG. 3C. The first stage (64) a may be configured as, for example, a driver stage; and the second stage (64b) may be configured as, for example, an output stage.

FIG. 3D shows that in some embodiments, a PA may be configured as a Doherty PA. Such a Doherty PA may include amplifying transistors (64a, 64 b) configured to provide carrier amplification and peaking amplification of an input RF signal (RF_in) to yield an amplified output RF signal (RF_out). The input RF signal may be split into the carrier portion and the peaking portion by a splitter. The amplified carrier and peaking signals may be combined to yield the output RF signal by a combiner.

FIG. 3E shows that in some embodiments, a PA may be implemented in a cascode configuration. An input RF signal (RF_in) may be provided to a base of the first amplifying transistor (64) a operated as a common emitter device. The output of the first amplifying transistor (64a) may be provided through its collector and be provided to an emitter of the second amplifying transistor (64b) operated as a common base device. The output of the second amplifying transistor (64b) may be provided through its collector so as to yield an amplified output RF signal (RF_out) of the PA.

In the various examples of FIG. 3A-FIG. 3E, the amplifying transistors are described as bipolar junction transistors (BJTs) such as heterojunction bipolar transistors (HBTs). It will be understood that one or more features of the present disclosure may also be implemented in or with other types of transistors such as field-effect transistors (FETs). For simplicity, throughout the disclosure, a "gate" or a "base" of a transistor will be referred to as a "base", a "drain" or a "collector" of a transistor will be referred to as a "collector", and a "source" or an "emitter" will be referred to as a "emitter".

FIG. 4 shows that in some embodiments, the amplification system (52) of FIG. 2 may be implemented as a high-voltage (HV) power amplification system (100). Such a system may include an HV power amplifier assembly (54) configured to include HV amplification operation of some or all of the PAs (e.g., 60a-60c). As described herein, such PAs may be biased by a bias system (56). The foregoing HV amplification operation may be facilitated by an HV supply system (58). An interface system (72) may be implemented to provide interface functionalities between the HV power amplifier assembly (54) and either or both of the bias system (56) and the HV supply system 58.

For the purpose of description, it will be understood that high-voltage (HV) can include voltage values that are higher than a battery voltage utilized in portable wireless devices. For example, an HV can be greater than 3.7V or 4.2V. In some situations, an HV can include voltage values that are greater than a battery voltage and at which portable wireless devices can operate more efficiently. In some situations, an HV can include voltage values that are greater than a battery voltage and less than a breakdown voltage associated with a given type of PA. In the example context of GaAs heterojunction bipolar transistor (HBT), such a breakdown voltage can be in a range of 15V to 25V. Accordingly, an HV for GaAs HBT PA can be in a range of, for example, 3.7V to 25V, 4.2V to 20V, 5V to 15V, 6V to 14V, 7V to 13V, or 8V to 12V.

Disclosed are examples related to use of a push-pull amplifier including a transformer balun. It will be understood that, although the power amplification system (500) illustrated in the examples of FIG. 5 comprises a push-pull amplifier circuit (510) and a transformer balun (519), in other embodiments, the amplification system (500) may comprise any other suitable type of power amplifier (510) comprising any other suitable type of transformer balun (519).

Figure 5:
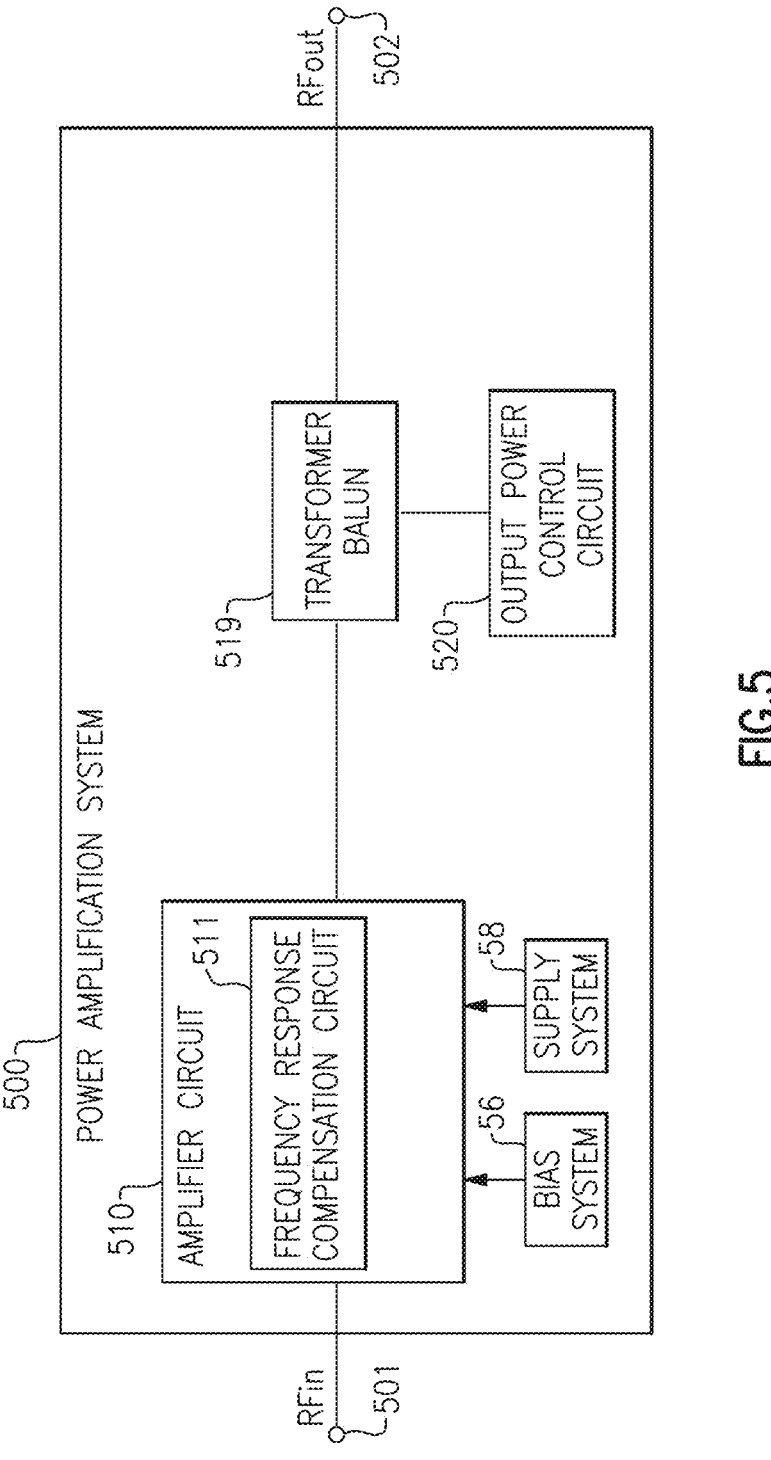
FIG. 5 illustrates an example power amplification system comprising an amplifier circuit, frequency response compensation circuit, transformer balun, and an output power control circuit, according to an embodiment.

FIG. 5 illustrates an exemplary power amplification system (500) comprising a push-pull amplifier circuit (510), a frequency response compensation circuit (511), a balun (519) (e.g. transformer balun), and a output power control circuit (520). The frequency response compensation circuit (511), in the example shown FIG. 5, is included in the amplifier circuit (510). However, in other embodiments, the frequency response compensation circuit (511) may form a part of another part of the power amplification system (500) that is not the amplifier circuit (510), or the frequency response compensation circuit (511) may be a separate part within the power amplification system (500). Similarly, the balun (519), in the example shown FIG. 5, is not included in the amplifier circuit (510). However, in other embodiments, the balun (519) may form a part of the amplifier circuit (510) or another part of the power amplification system (500).

The power amplification system (500) of FIG. 5 is configured to amplify an input radio-frequency (RF) signal (RFin) received at an input node (501) to generate an output RF signal (RFout) at an output node (502). The output power control circuit (520) is configured to provide two or more values of capacitance. One of the capacitance values that the output power control circuit (520) can provide may be a low value close to zero (in the case of open circuit). As the output power control circuit (520) is coupled to the balun (519), changing the capacitance value provided by the output power control circuit (520) leads to a change of a capacitance value of the balun (519). The balun (519) may comprise a termination capacitor (852). In such cases, the output power control circuit (520) may be coupled to the termination capacitor (582) of the balun (519). In such cases, the total termination capacitance of the balun (519) is determined by: the value of the termination capacitor (852) of the balun (519), the capacitance value provided by the power control circuit (520), and the manner in which the termination capacitor (852) of the balun (519) and the power control circuit (520) are connected (e.g. in parallel or in series). Consequently, switching the capacitance value of the power control circuit (520) enables control of the total termination capacitance of the balun (519), which in turn enables load line control. The switching of the capacitance value of the power control circuit (520) will be discussed further with respect to FIG. 6.

Figure 13:
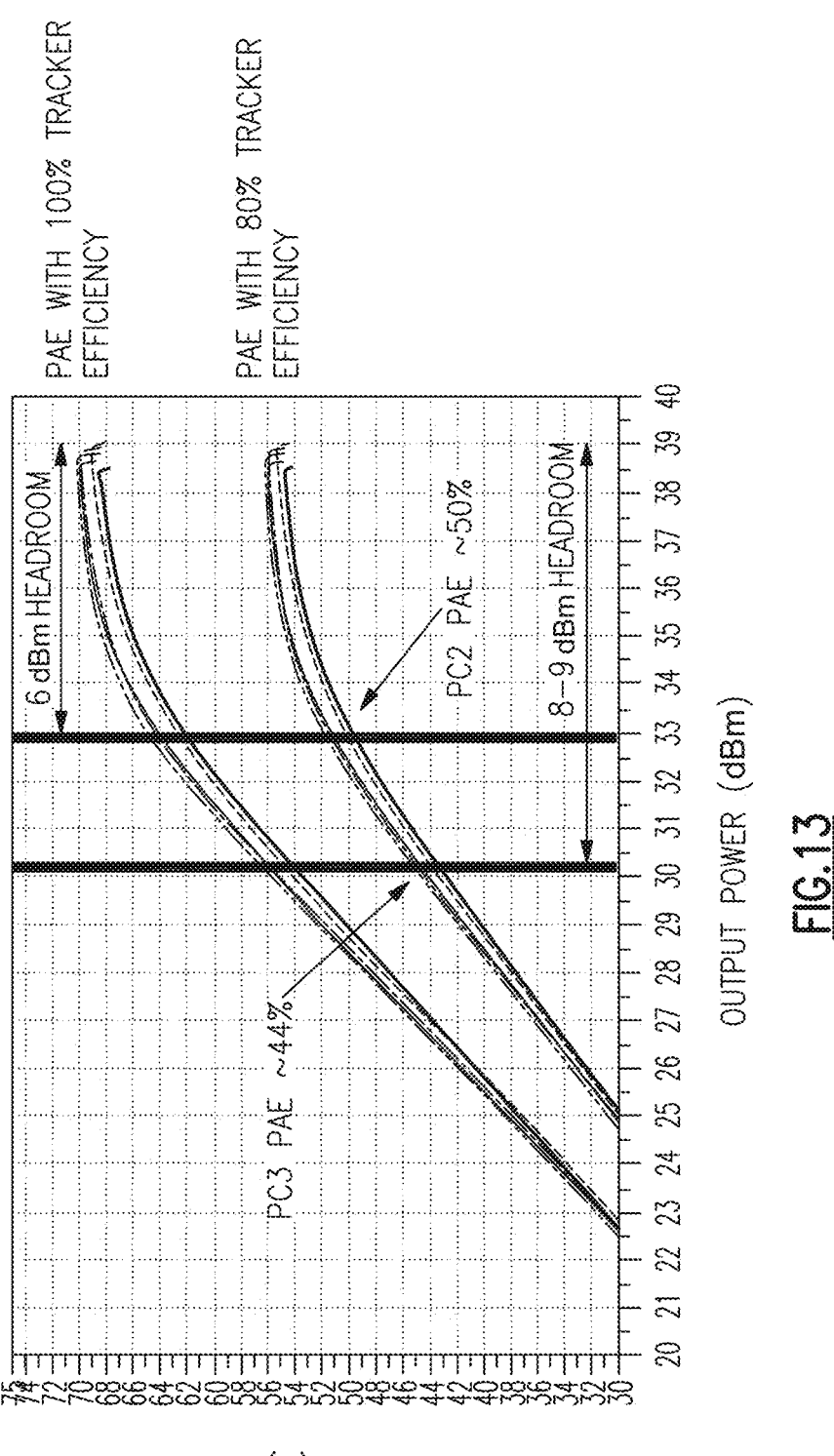
FIG. 13 is an exemplary graph illustrating PAE variation over output power of an exemplary power amplifier configured to support frequency bands that need to operate at different power levels.

FIG. 13 illustrates power-added efficiency (PAE) variation over output power of an exemplary power amplifier configured to support frequency bands that need to operate at different power levels. In particular, FIG. 13 shows variation over output power for a power amplifier that needs to operate at both Power Class 2 (PC2) and Power Class 3 (PC3) power levels specified by the 3GPP communication standard. In such a case, PC2 requirement sets the maximum power of the power needs because PC2 requires higher output power than PC3. However, this decreases the PAE of the amplifier during PC3 band operation because the power amplifier would still be operating with the maximum output power set by the PC2 requirement. For example, as shown in FIG. 13, the power amplifier may have a suitable level of headroom of ~6 dB during PC2 operation, leading to PAE of ~50% with 80% tracker efficiency, and ~62% with 100% tracker efficiency. However, the power amplifier may have an excessive level of headroom of 8-9 dB during PC3 operation, leading to significantly decreased PAE of ~44% with 80% tracker efficiency, and ~54% with 100% tracker efficiency.

The output power control circuit (520) of FIG. 5 can be particularly useful for improving the power-added efficiency (PAE) of the power amplification system (500) when the power amplification system (500) is configured to accommodate two or more bands of frequencies and/or power modes as shown in the example of FIG. 13. The improvement of the PAE is achieved by adjusting the output power, by controlling the capacitance provided by the output power control circuit (520), according to the output power requirements set by the frequency band of operation. This can minimize unnecessary output power headroom, particularly when the frequency band of operation requires lower output power from the power amplification system (500). The PAE improvement achieved by output power control circuit (520) will be discussed further with respect to FIG. 7-FIG. 9B.

The frequency response compensation circuit (511) is configured to reduce variation over frequency of a number of metrics of the power amplification system (500). For example, the frequency response compensation circuit (511) reduces variation over frequency of a load impedance of the power amplification system (500). The frequency response compensation circuit (511) is configured to provide two or more values of capacitance. One of the capacitance values that the frequency response compensation circuit (511) can provide may be a low value close to zero. The low value that the frequency response compensation circuit (511) can provide may be determined and/or optimized based on a tradeoff between the on-resistance and off-capacitance of the tuning switch (866). Generally, lower off-capacitance of the tuning switch (866) leads to higher on-resistance of the tuning switch (866), and higher on-resistance of the tuning switch (866) may lead to degradation of the PAE of the power amplification system (500) when the tuning switch (866) is on. The frequency response compensation circuit (511) is coupled to at least two of the transistors of the amplifier circuit (510). As a result, changing the capacitance value provided by the frequency response compensation circuit (511) leads to a change of a capacitance value of the amplifier circuit (510). For example, the frequency response compensation circuit (511) may be connected to a collector or a emitter of a first transistor (843) of the amplifier circuit (510) and a collector or a emitter a second transistor (842) of the amplifier circuit (510). The amplifier circuit (510) may optionally comprise a capacitor (862) connecting two of the transistors (842, 843) of the amplifier circuit (510). In such cases, the frequency response compensation circuit (511) may be coupled to the capacitor (862) connecting the two of the transistors (842, 843). In such cases, the total capacitance of the amplifier circuit (510) is dependent on: the value of the capacitor (862) connecting the two of the transistors (842, 843) of the amplifier circuit (510), the capacitance value provided by the frequency response compensation circuit (511), and the manner in which the capacitor (862) connecting the two of the transistors (842, 843) and the frequency response compensation circuit (511) are connected (e.g. in parallel or in series). Consequently, switching the capacitance value of the frequency response compensation circuit (511) enables control of the total capacitance of the amplifier circuit (510), which in turn enables adjustment of reactance of the amplifier circuit (510). The switching of the capacitance value of the frequency response compensation circuit (511) will be discussed further with respect to FIG. 6.

Figure 9B:
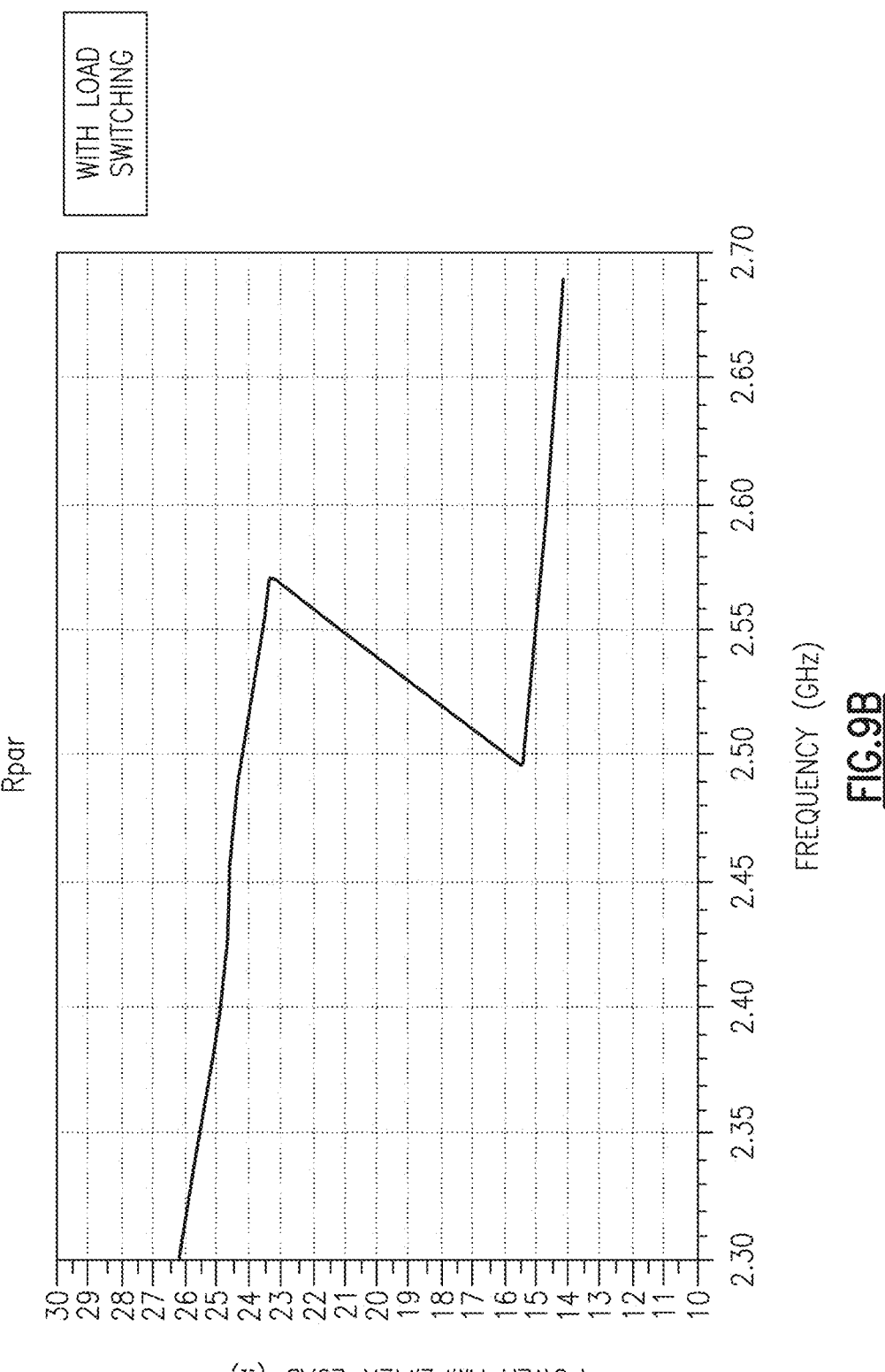
FIG. 9B is an exemplary graph illustrating how a power amplifier load impedance changes over frequency in an exemplary power amplifier system with an output power control circuit, according to an embodiment.
Figure 10:
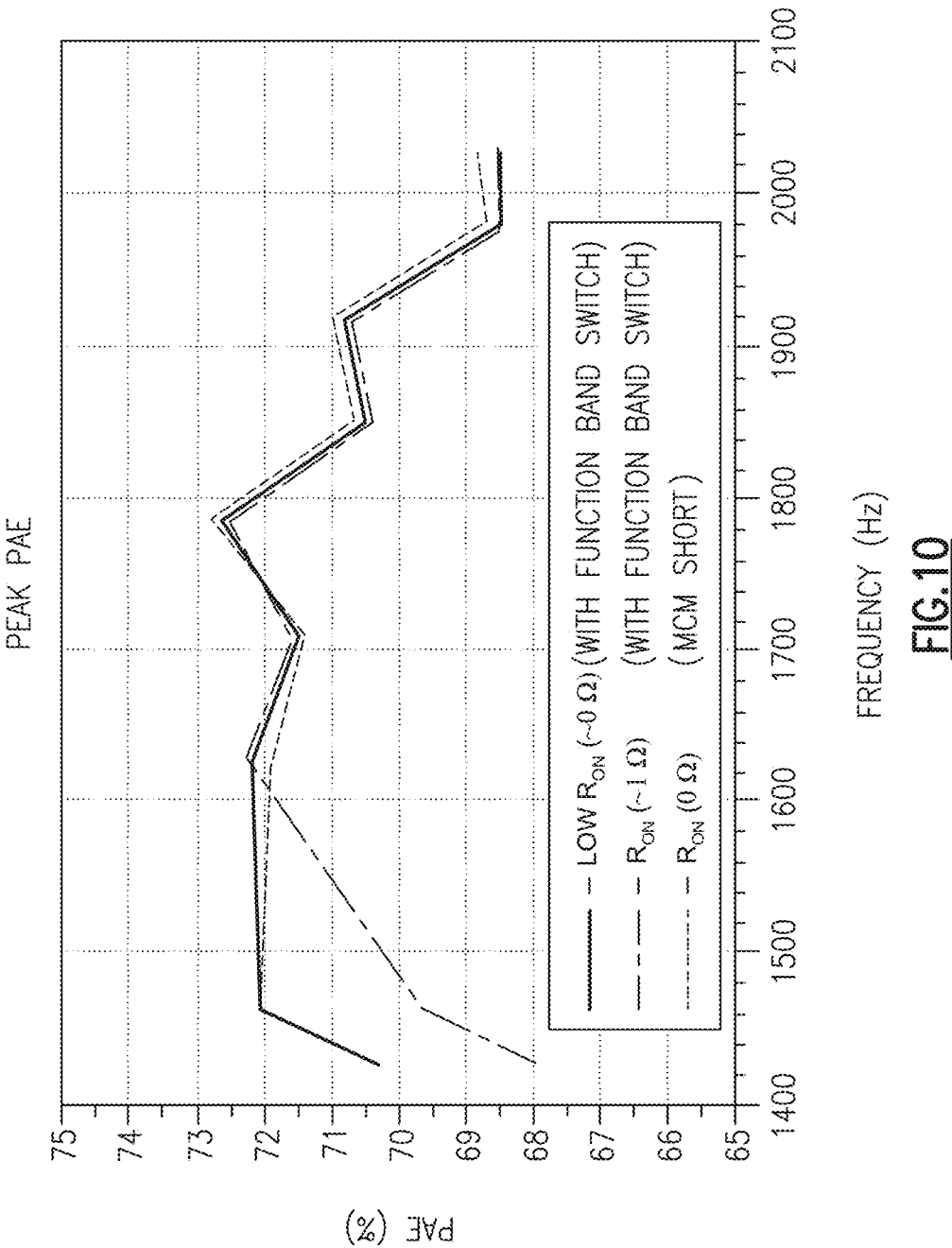
FIG. 10 is an exemplary graph illustrating PAE variation over frequency according to an embodiment.

The frequency response compensation circuit (511) can be particularly useful for improving the PAE of the power amplification system (500) when the power amplification system (500) is configured to accommodate a wide bandwidth of frequencies. The improvement of the PAE is achieved by adjusting the reactance of the amplifier circuit (510), by controlling the capacitance provided by the frequency response compensation circuit (511), according to the frequency band of operation. This can reduce variation over frequency of the PAE and/or the saturated output power (Psat) of the power amplification system (500), particularly at lower frequencies. The PAE improvement achieved by output power control circuit (520) will be discussed further with respect to FIG. 9B is an exemplary graph illustrating how a power amplifier load impedance changes over frequency in an exemplary power amplifier system with an output power control circuit, according to an embodiment; FIG. 10.

The power amplification system (500) of FIG. 5 optionally comprises a bias system (56) configured to provide a bias voltage to one or more transistors of the power amplification system (500), and a supply system (58) configured to provide a supply voltage to the amplifier circuit (510). In the example shown FIG. 5, the bias system (56) and the supply system (58) are not included in the amplifier circuit (510). However, in other embodiments, at least one of the bias system (56) and the supply system (58) may form a part of the amplifier circuit (510) or other part of the power amplification system (500). Alternatively, the bias system

(56) and the supply system (58) may be located outside the power amplification system (500). The amplifier circuit (510) may be or may comprise a push-pull amplifier (510).

The power amplifier circuit (510) can be or comprise any of the power amplifiers described above with respect to FIG. 3A-FIG. 3E, a push-pull amplifier, or any other type of power amplifier. The power amplifier circuit (510) comprises an amplifier element configured to amplify the RF signal. The amplifier element may include, for example, one or more transistors. The amplifier element may be powered by a supply voltage ($V_{CC}$) and include a connection to a ground voltage. The supply voltage ($V_{CC}$) may be provided by the supply system (58).

Figure 6:
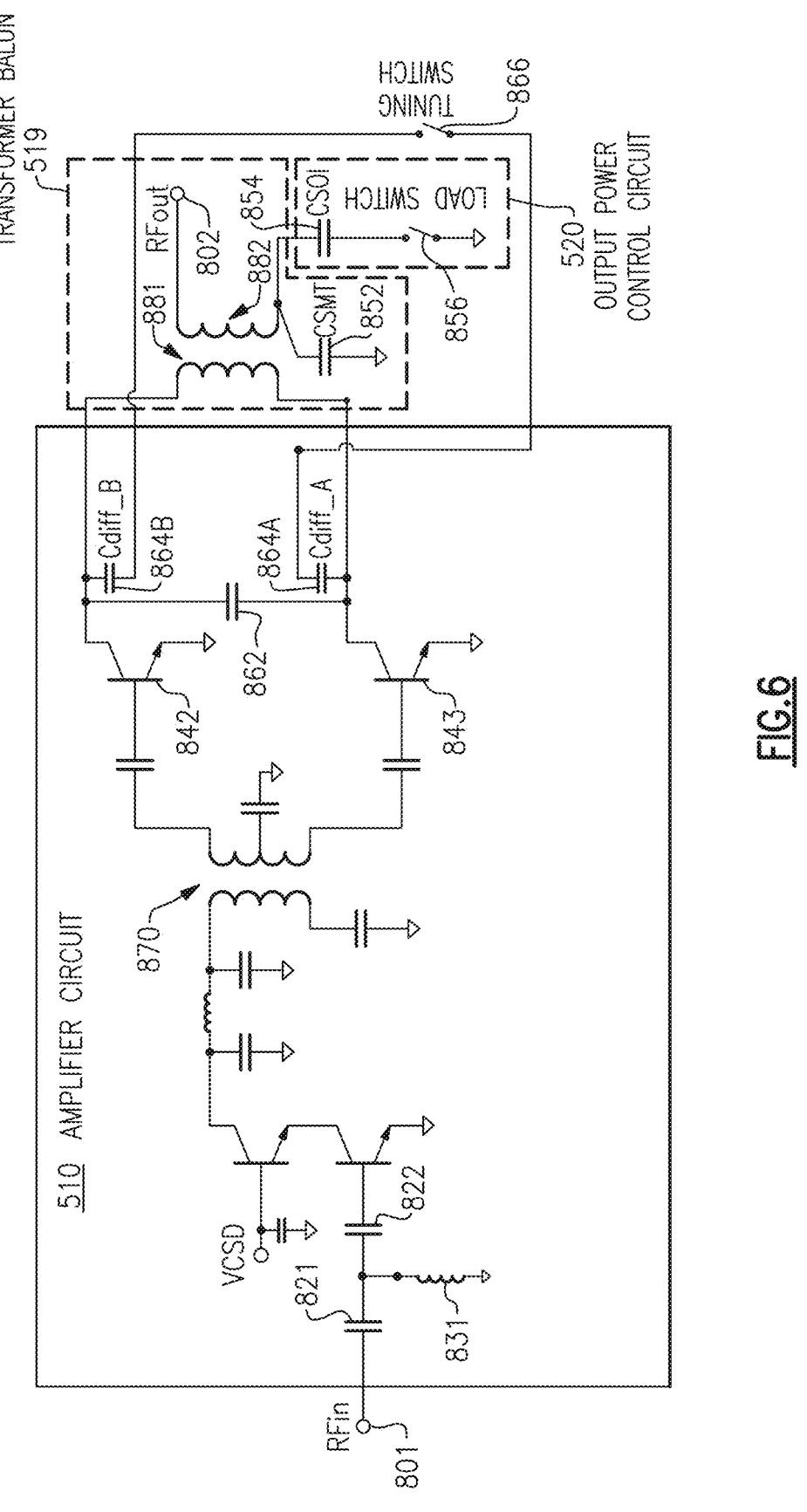
FIG. 6 illustrates a circuit diagram of an example power amplification system comprising an amplifier circuit, frequency response compensation circuit, transformer balun, and an output power control circuit, according to an embodiment.

FIG. 6 illustrates a circuit diagram of an exemplary power amplification system (500) comprising a push-pull amplifier circuit (510), a frequency response compensation circuit (511), a balun (519) (e.g. transformer balun), and an output power control circuit (520). The power amplification system (500) is configured to amplify an input radio-frequency (RF) signal (RFin) received at an input node (801) to generate an output RF signal (RFout) at an output node (802).

The power amplification system (500) may comprise one or more drive transistors. The power amplification system (500) may comprise a first capacitor (821), a second capacitor (822) coupled in series between the input node (801) and the base of at least one of the drive transistor. The power amplification system (500) may comprise a first inductor (831) having a first end coupled to a node between the first capacitor (821) and the second capacitor (822) and having a second end coupled to a ground voltage. The power amplification system (500) may comprise or be connected to a drive bias circuit powered by a supply voltage (Vcc). The drive bias circuit may be coupled to the base of the one or more drive transistors and configured to bias the drive transistor.

The power amplification system (500) may comprise a transformer divider (870). The transformer divider (870) may comprise a first coil and a second coil. A first end of the first coil may be coupled to the collector of the one or more drive transistors and a second end of the first coil may be coupled to the ground voltage via a capacitor. The first end and second end of the second coil may be coupled, via respective capacitors, to respective bases of respective differential transistors (842, 843). Although each of the first end and second end of the second coil in the example of FIG. 6 is coupled to one differential transistor (842, 843), in other embodiments, at least one of the first end and second end of the second coil may be coupled to two or more differential transistors (842, 843).

The power amplification system (500) comprises a balun (519). Although the balun (519) in the example of FIG. 6 is a transformer balun (519), in other embodiments the balun (519) may be any suitable type of balun (519). The balun (519) may comprise a first coil (881) (e.g. a primary coil) and a second coil (882) (e.g. a secondary coil). In such cases, each of the first and second coils (881, 882) comprises a first end and a second end. The first and second ends of the first coil (881) are respectively coupled to the collectors of the differential transistors (842, 843). The second end of the second coil (882) is coupled to the ground voltage via a termination capacitor (852). The termination capacitor (852) in the example of FIG. 6 is optionally a surface-mount capacitor (CSMT). However, in other embodiments the termination capacitor (852) may be any other type of capacitor, such as a silicon-on-insulator (SOI) capacitor or a metal-oxide-semiconductor (MOS) capacitor. The first end of the second coil (882) is coupled to an RF output node (802). Optionally, the balun (519) may be an integrated passive device (IPD) balun.

The power amplification system (500) comprises a frequency response compensation circuit (511) coupled to the differential transistors (842, 843). As shown in the example of FIG. 6, the frequency response compensation circuit (511) may comprise a first tuning capacitor (864A), a tuning switch (866), and a second tuning capacitor (864B) connected in series. The first tuning capacitor (864A) may be coupled to the collector of the first differential transistor (843), the second tuning capacitor (864B) may be coupled to the second differential transistor, and the tuning switch (866) may connect the first and second tuning capacitors (864A, 864B). As shown in the example of FIG. 6, the amplifier circuit (510) may optionally also comprise a capacitor (862) connecting the collectors of the differential transistors (842, 843). In such cases, the frequency response compensation circuit (511) may be coupled to the capacitor (862) connecting the two differential transistors (842, 843). The tuning switch (866) may be any suitable types of switch that can provide on and off modes, such as a FET switch.

When the tuning switch (866) is on, the frequency response compensation circuit (511) connects the tuning capacitor(s) (864A, 864B) to the amplifier circuit (510) to provide additional capacitance. On the other hand, when the tuning switch (866) is off, the frequency response compensation circuit (511) forms an open circuit, therefore, the frequency response compensation circuit (511) has no influence on the capacitance of the amplifier circuit (510). In the example of FIG. 6, when the tuning switch (866) is off, the capacitance between the collectors of the first and second differential transistors (842, 843) is equal to the value of the capacitor (862) connecting the collectors of the first and second differential transistors (842, 843). On the other hand, when the tuning switch (866) is on, the capacitance between the collectors of the first and second differential transistors (842, 843) is equal to:

$$C_1 + \cfrac{1}{\cfrac{1}{C_{diff\_A}} + \cfrac{1}{C_{diff\_B}}}$$

wherein $C_1$ is the value of the capacitor (862) connecting the collectors of the first and second differential transistors (842, 843), $C_{diff\_A}$ is the value of the first tuning capacitor (864A), and $C_{diff\_B}$ is the value of the second tuning capacitor (864B).

Although in the example of FIG. 6, the frequency response compensation circuit (511) comprises two tuning capacitors (864A, 864B) and one tuning switch (866), in other embodiments the frequency response compensation circuit (511) may comprise any number of tuning capacitor(s) (864A, 864B) and any number of tuning switch(es) (866) connected in series or parallel. For example, the frequency response compensation circuit (511) may only comprise one tuning capacitor and one tuning switch (866). In such a case, the capacitance between the collectors of the first and second differential transistors (842, 843) is equal to:

$$C_1 + C_{diff}$$

wherein $C_1$ is the value of the capacitor (862) connecting the collectors of the first and second differential transistors (842, 843) and $C_{diff}$ is the value of the one tuning capacitor (864A).

It will be understood that, in other embodiments, the capacitor (862) connecting the first and second differential transistors (842, 843) and/or the frequency response compensation circuit (511) may be connected to other parts of the first and second differential transistors (842, 843), such as the emitters, instead of the collectors. It will also be understood that, in other embodiments, the power amplification system (500) may not comprise the capacitor (862) connecting the first and second differential transistors (842, 843). In such cases, the capacitance between the collectors of the first and second differential transistors (842, 843) is equal to the capacitance value of the frequency response compensation circuit (511).

The frequency response compensation circuit (511) may optionally comprise a plurality of tuning switches. In such cases, each of the tuning switches may be coupled to one or more tuning capacitors. Such configurations enables the frequency response compensation circuit (511) to provide a plurality of capacitance values alongside the low capacitance having a value close to zero (in the case of open circuit).

Having such a frequency response compensation circuit (511) in the power amplification system (500) can be particularly useful for improving the PAE of the power amplification system (500) when the power amplification system (500) is configured to accommodate a wide bandwidth of frequencies. The improvement of the PAE is achieved by adjusting the reactance of the amplifier circuit (510), by controlling the capacitance provided by the frequency response compensation circuit (511), according to the frequency band of operation. This can reduce variation over frequency of the PAE and/or the saturated output power (Psat) of the power amplification system (500), particularly at lower frequencies.

FIG. 9B is an exemplary graph illustrating how a power amplifier load impedance changes over frequency in an exemplary power amplifier system with an output power control circuit, according to an embodiment; FIG. 10 is a graph showing an exemplary PAE variation over frequency. Reactance is generally inversely proportional to both capacitance and frequency. In the example of FIG. 9B is an exemplary graph illustrating how a power amplifier load impedance changes over frequency in an exemplary power amplifier system with an output power control circuit, according to an embodiment; FIG. 10, the on-resistance ($R_{ON}$) of the tuning switch (866) has a high value of ~1Ω when additional tuning capacitor(s) (864A, 864B) are not connected to the amplifier circuit (510) (i.e. the tuning switch (866) is off). On the other hand, the $R_{ON}$ of the tuning switch (866) has a low value close to 0Ω when additional tuning capacitor(s) (864A, 864B) are connected to the amplifier circuit (510) (i.e. the tuning switch (866) is on). It can be seen from FIG. 9B is an exemplary graph illustrating how a power amplifier load impedance changes over frequency in an exemplary power amplifier system with an output power control circuit, according to an embodiment; FIG. 10 that, when the tuning switch (866) is off ($R_{ON}\approx1$), the power amplification system (500) suffers from PAE reduction at lower frequencies. This can be attributed to higher reactance at lower frequency. Such losses of PAE can be compensated by connecting the additional tuning capacitor(s) (864A, 864B) to the amplifier circuit (510) by turning the tuning switch (866) on. FIG. 9B is an exemplary graph illustrating how a power amplifier load impedance changes over frequency in an exemplary power amplifier system with an output power control circuit, according to an embodiment; FIG. 10 also illustrates an exemplary PAE variation over frequency (MCM SHORT) for a hypothetical scenario wherein the tuning switch (866) is a perfect switch having zero $R_{ON}$.

The power amplification system (500) comprises an output power control circuit (511) coupled to the balun (519). As shown in the example of FIG. 6, the output power control circuit (511) may comprise a load control capacitor (854), and a load control switch (856) connected in series. The load control capacitor (854) may be coupled to the second end of the second coil (882) of the balun (519), and the load control capacitor (854) may be coupled to the ground voltage via the load control switch (856). Alternatively, in other embodiments, the load control switch (856) may be coupled to the second end of the second coil (882) of the balun (519), and the load control switch (856) may be coupled to the ground voltage via the load control capacitor (854). As shown in the example of FIG. 6, the balun (519) may comprise a termination capacitor (852) connecting the second end of the second coil (882) of the balun (519) to the ground voltage. In such cases, output power control circuit (511) may be coupled to the termination capacitor (852). The load control capacitor (854) in the example of FIG. 6 is optionally a silicon-on-insulator (SOI) capacitor (CSOI). However, in other embodiments the load control capacitor (854) may be any other type of capacitor, such as a surface-mount capacitor (CSMT) or a metal-oxide-semiconductor (MOS) capacitor. The load control switch (856) may be any suitable types of switch that can provide on and off modes, such as a FET switch.

When the load control switch (856) is on, the output power control circuit (511) connects the load control capacitor (854) to the balun (519) to provide additional capacitance. On the other hand, when the load control switch (856) is off, the output power control circuit (511) forms an open circuit, therefore, the output power control circuit (511) has no influence on the capacitance of the balun (519). In the example of FIG. 6, when the load control switch (856) is off, the capacitance between the second end of the second coil (882) of the balun (519) and the ground is equal to the value of the termination capacitor (852), $C_{SMT}$. On the other hand, when the load control switch (856) is on, the capacitance between the second end of the second coil (882) of the balun (519) and the ground is equal to:

$$C_{SMT} + C_{SOI}$$

wherein $C_{SMT}$ is the termination capacitor (852) and $C_{SOI}$ is the value of the load control capacitor (856).

Although in the example of FIG. 6, the output power control circuit (511) comprises one load control capacitor (854) and one load control switch (856), in other embodiments the output power control circuit (511) may comprise any number of load control capacitors and load control switch(es).

It will be understood that, in other embodiments, the termination capacitor (852) and/or the output power control circuit (511) may be connected to other parts of the balun (519), such as a node located between the first and second ends of the second coil (882), instead of the second end of the second coil (882). It will also be understood that, in other embodiments, the balun (519) may not comprise the termination capacitor (852). In such cases, the capacitance between the balun (519) and the ground is equal to the capacitance value of the output power control circuit (511).

The output power control circuit (511) may optionally comprise a plurality of load control switches. In such cases, each of the load control switches may be coupled to one or more load control capacitors. Such configurations enable the output power control circuit (511) to provide a plurality of capacitance values alongside the low capacitance having a value close to zero (in the case of open circuit).

The output power control circuit (520) can be particularly useful for improving the PAE of the power amplification system (500) when the power amplification system (500) is configured to accommodate two or more bands of frequencies and/or power modes. The improvement of the PAE is achieved by adjusting the output power, by controlling the capacitance provided by the output power control circuit (520), according to the output power requirements set by the frequency band of operation. This can minimize unnecessary output power headroom, particularly when the frequency band of operation requires lower output power from the power amplification system (500).

Figure 7A:
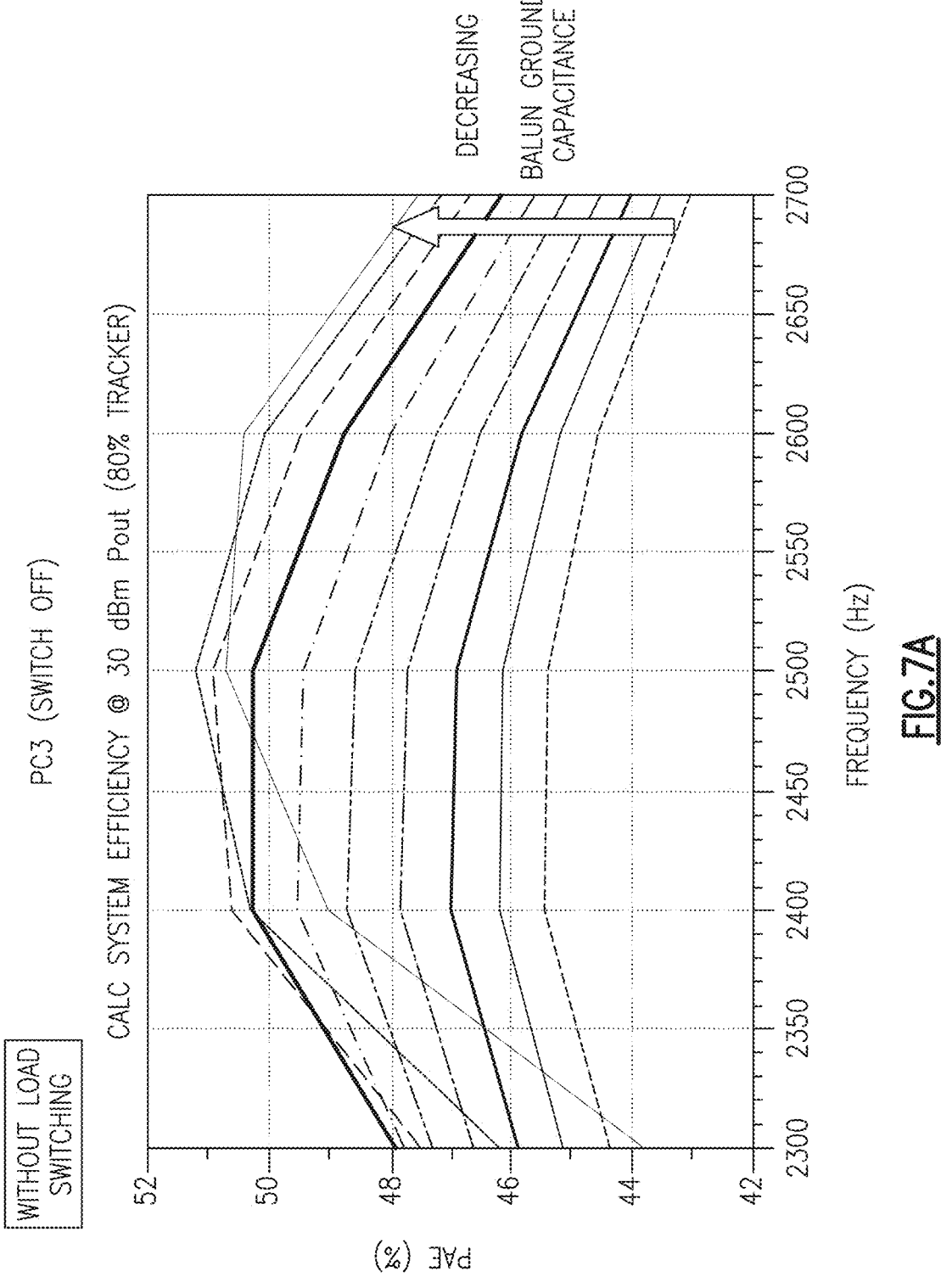
FIG. 7A is an exemplary graph illustrating how power-added efficiency (PAE) variation over frequency changes depending on the value of a termination capacitor of a balun when a load control switch is off, according to an embodiment.

FIG. 7A is an exemplary graph illustrating how PAE variation over frequency changes depending on the value of the termination capacitor (852) of the balun (519) when the load control switch (856) is off. As one mode of operation (e.g. PC3 operation) requires lower output power than another mode of operation (e.g. PC2 operation), it may be preferable to decrease the capacitance of the balun (519). The capacitance of the balun (519) may be decreased by turning off the load control switch (856) and optionally replacing the termination capacitor (852) of the balun (519) with a capacitor having a lower value.

Figure 7B:
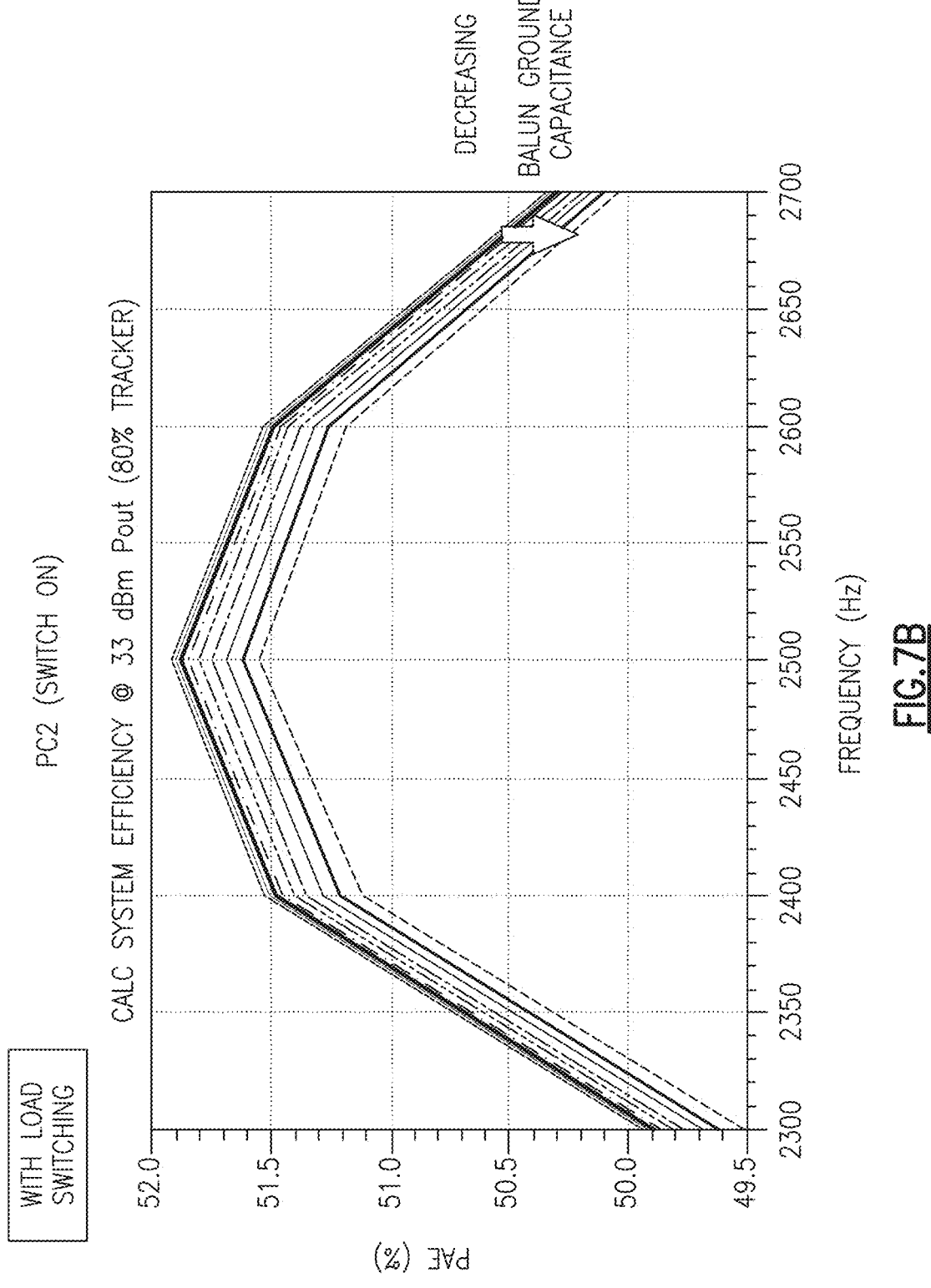
FIG. 7B is an exemplary graph illustrating how PAE variation over frequency changes depending on the value of a termination capacitor (852) of a balun (519) when a load control switch (856) is on, according to an embodiment.

However, decreasing the capacitance of the balun can be problematic for higher power operation, such as PC2 operation which requires higher output power than PC3 operation. The output power control circuit (520) can be particularly useful in such cases, as it can provide additional capacitor(s) that can be connected to and disconnected from the balun (519) depending on the required output power. FIG. 7B is an exemplary graph illustrating how PAE variation over frequency changes depending on the value of the termination capacitor (852) of the balun (519) when the load control switch (856) is on. In this case, for PC2 operation, the output power control circuit (520) can provide additional capacitance to the balun (519) in addition to the optimal capacitance value of the balun (519) for PC3 operation.

Figure 8A:
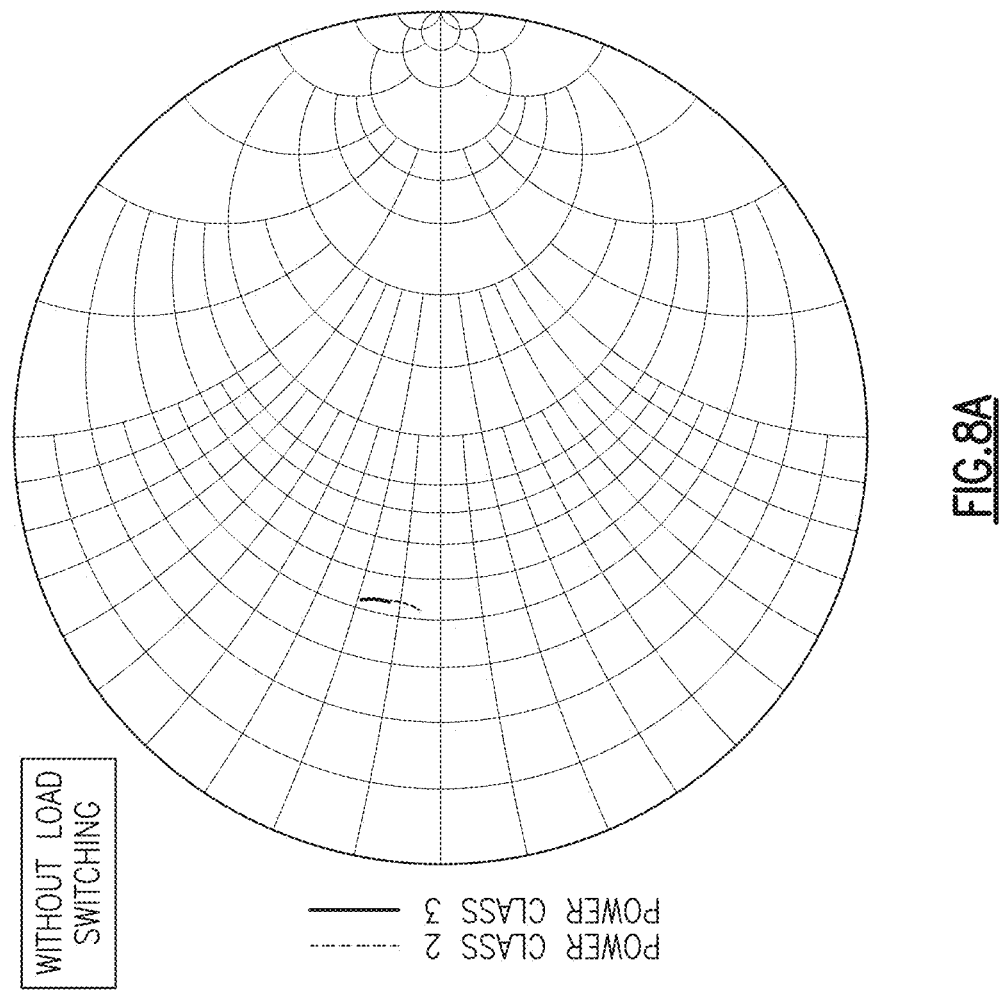
FIG. 8A is an exemplary Smith Chart according to an embodiment.
Figure 9A:
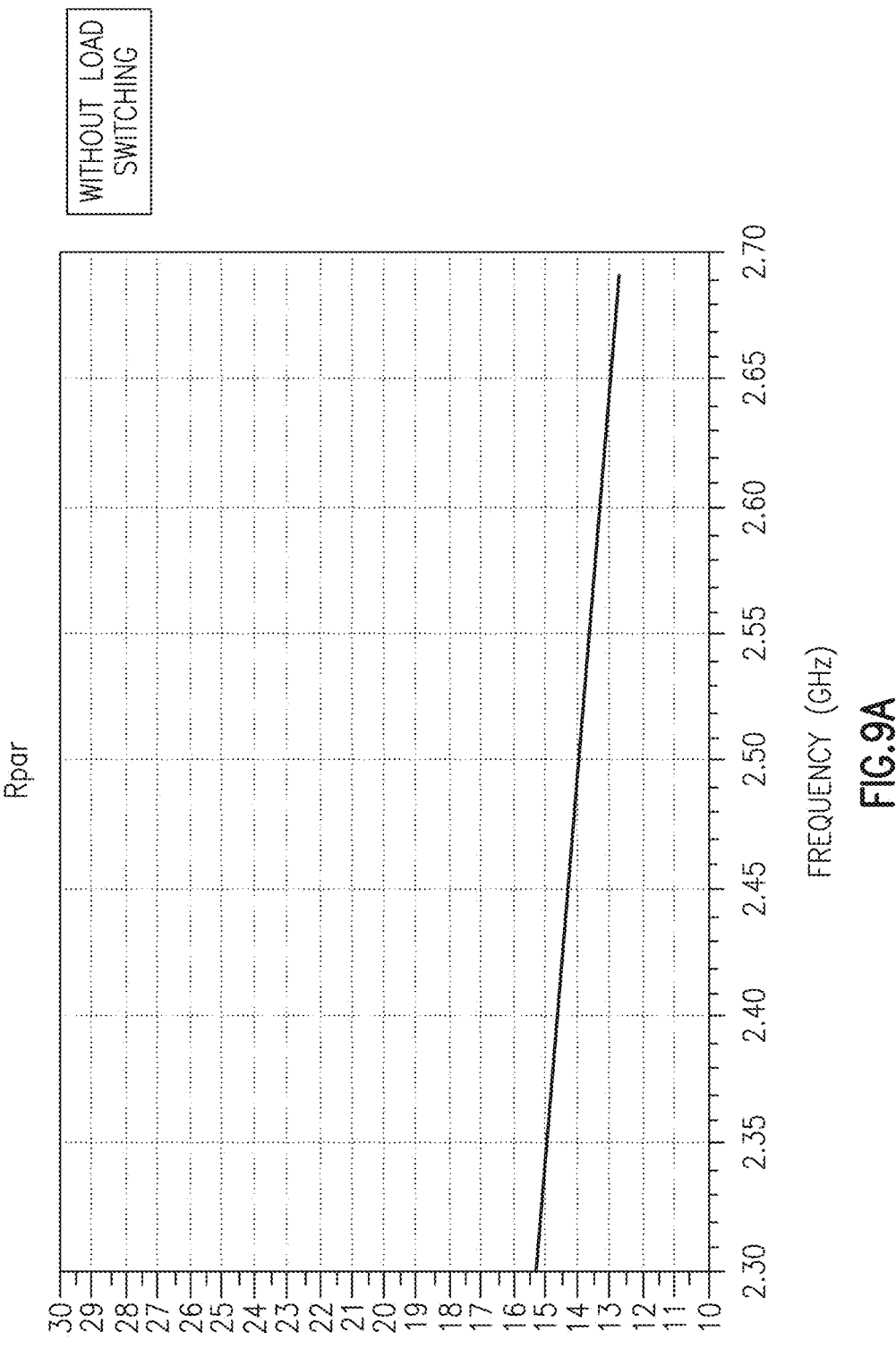
FIG. 9A is an exemplary graph illustrating how a power amplifier load impedance changes over frequency in an exemplary power amplifier system without an output power control circuit, according to an embodiment.

FIG. 9A illustrates how the power amplifier load impedance changes over frequency in an exemplary power amplifier system without the output power control circuit (520). The graph shows that the load impedance is inversely proportional to the frequency. FIG. 8A illustrates a corresponding Smith Chart, showing that the output power of the amplifier system without the output power control circuit (520) is not adapted depending on the band of frequencies and/or power modes.

Figure 8B:
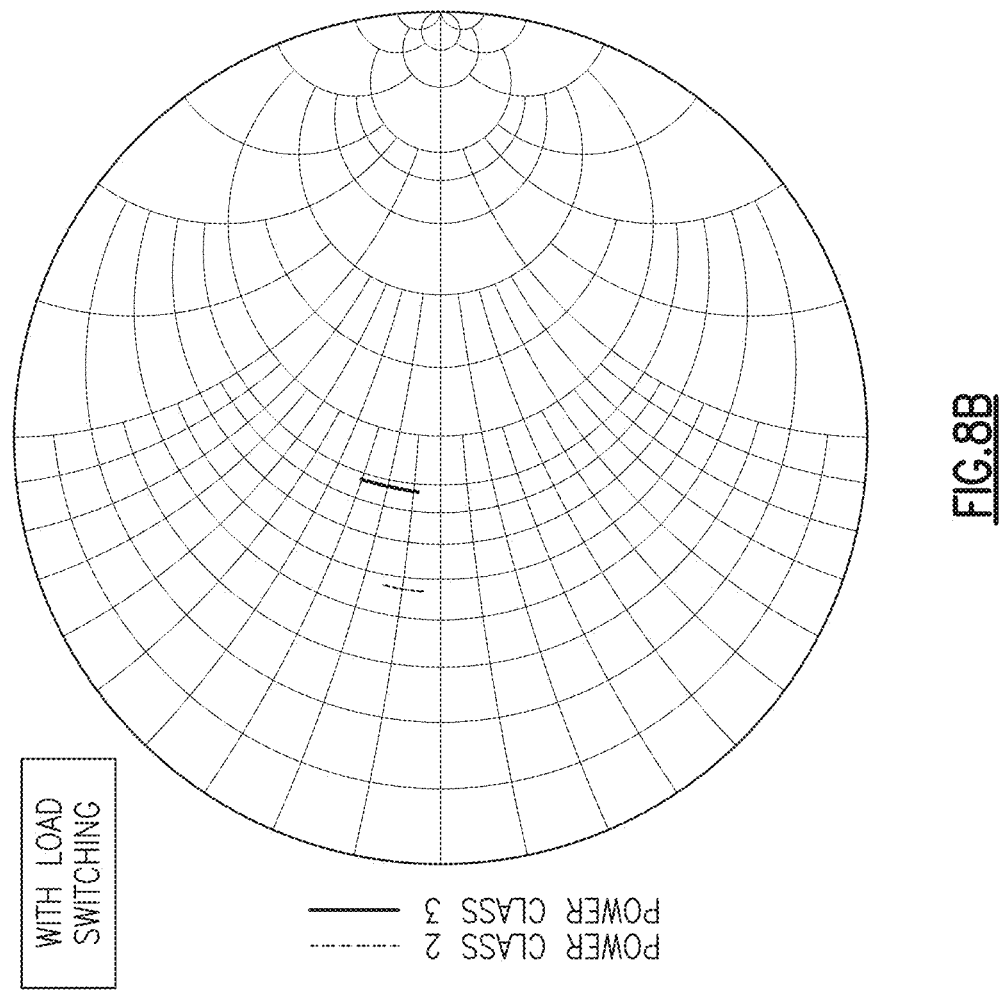
FIG. 8B is an exemplary Smith Chart according to an embodiment.

On the other hand, FIG. 9B illustrates how the power amplifier load impedance changes over frequency in an exemplary power amplifier system with the output power control circuit (520). Unlike the example of FIG. 9A and FIG. 8A, the output power control circuit (520) enables the load impedance to be increased for PC3 band and decreased for PC2 band. In the example shown in FIG. 9B, the switching of the output power control circuit (520) takes place at 2570 Hz. FIG. 8B illustrates a corresponding Smith Chart, showing that the output power of the amplifier system with the output power control circuit (520) is adapted depending on the band of frequencies and/or power modes.

Using the output power control circuit (520) in this way can provide an easy way to switch between a plurality of selectable capacitance values of the balun (519) depending on the required output power.

Whilst the output power control circuit (520) has been described, in relation to FIG. 5 and FIG. 6, as being provided in combination with the frequency response compensation circuit (511), this is not required. Either can be implemented alone without the other. That is, embodiments of the power amplification system (500) that are implemented without the frequency response compensation circuit (511) may not comprise the one or more of the parts and/or components shown in FIG. 5 and/or FIG. 6, including: the tuning capacitor(s) (864A, 864B), the tuning switch (866), and the capacitor (862) connecting two of the transistors (842, 843). Similarly, embodiments of the power amplification system (500) that are implemented without the output power control circuit (520) may not comprise the one or more of the parts and/or components shown in FIG. 5 and/or FIG. 6, including: the load control capacitor (854), the load control switch (856), and the balun (519) or one or more parts of the balun (519) such as the termination capacitor (852) connecting the second coil (882) of the balun (519) to the ground.

In embodiments of the power amplification system (500) that are implemented with both the output power control circuit (520) and the frequency response compensation circuit (511), such as the power amplification system (500) according to FIG. 5 and FIG. 6, the features and advantages of the output power control circuit (520) and the frequency response compensation circuit (511) may be cooperated in a synergistic manner to allow effective PAE improvement over an extended bandwidth. As discussed with respect to FIG. 7, FIG. 8, FIG. 9 and FIG. 13, the output power control circuit (520) improves PAE by minimizing unnecessary power headroom, whereas, as discussed with respect to FIG. 9B is an exemplary graph illustrating how a power amplifier load impedance changes over frequency in an exemplary power amplifier system with an output power control circuit, according to an embodiment; FIG. 10, the frequency response compensation circuit (511) improves PAE across extended bandwidth. In other words, the output power control circuit (520) controls the real part of the load impedance which affects the output power of the power amplification system (500), and the frequency response compensation circuit (511) controls the imaginary part of the load impedance which affects the frequency response of the power amplification system (500). Therefore, the combination of the output power control circuit (520) and the frequency response compensation circuit (511) can synergistically improve the parameters of the power amplification system (500) that are dependent on both the real and imaginary parts of the load impedance, such as PAE. Furthermore, combining the output power control circuit (520) and the frequency response compensation circuit (511) can provide PAE enhancement across extended bandwidth at the same time as meeting various requirements set by size constraints of the power amplification system (500) and/or devices comprising the power amplification system (500).

One or more advantageous features of the power amplification system (500) described herein may be combined with one or more other types of power amplifier architectures. For example, advanced power tracking and/or envelop tracking techniques and/or architectures may be used in conjunction with at least one of the output power control circuit (520) and the frequency response compensation circuit (511).

Optionally, one or more part of the output power control circuit (520) and/or the frequency response compensation circuit (511) may be controlled by a CMOS control. In such cases, the CMOS control may be configured to receive band and/or power mode controls over a MIPI digital interface.

Figure 11:
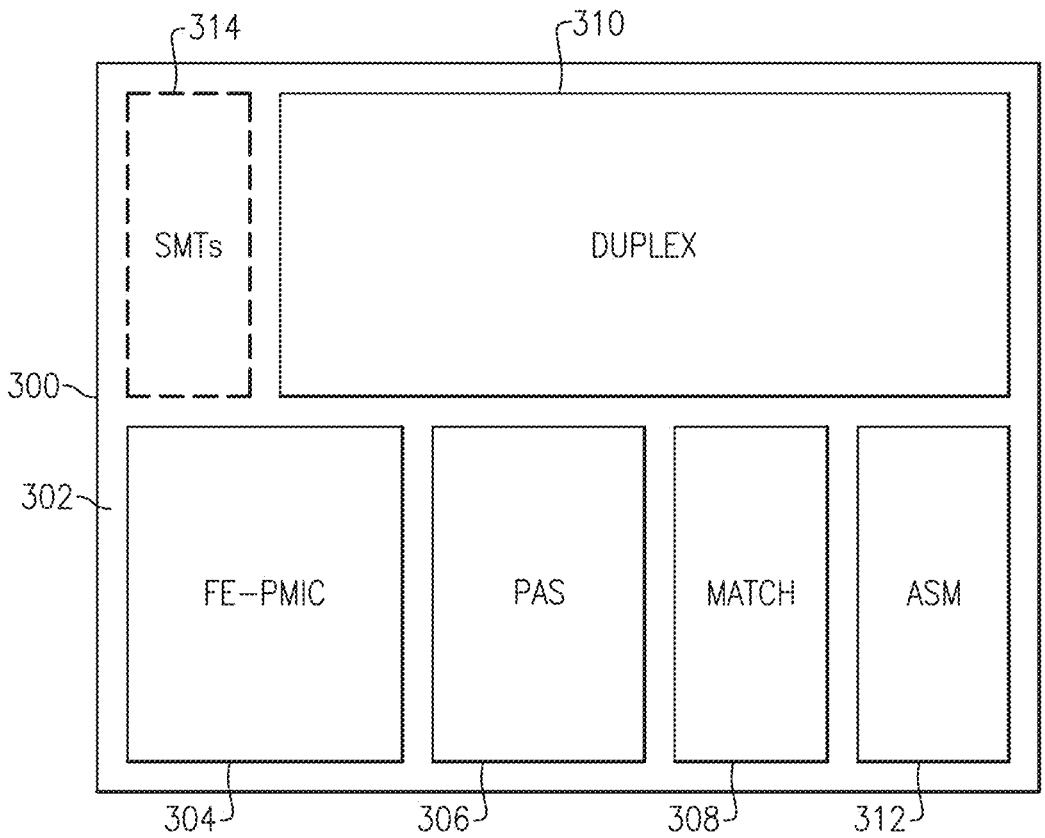
FIG. 11 illustrates an example wireless module according to an embodiment.

As illustrated in FIG. 11 all or at least a part of the power amplification system (500) may be implemented in a module (300). Such a module (300) may be, for example, a front-end module (FEM). In the example of FIG. 11, a module (300) may comprise a packaging substrate (302), and a number of components may be mounted on such a packaging substrate. For example, an Front-end Power Management Integrated Circuit (FE-PMIC) component (304), a power amplifier assembly (306), a match component (308), and a duplexer assembly (310) may be mounted and/or implemented on and/or within the packaging substrate (302). The power amplifier assembly (306) may comprise at least a part of the frequency response compensation circuit (511) and/or at least a part of the output power control circuit (520), such as those described above with respect to FIG. 5 and FIG. 6. The power amplifier assembly (306) may include a push-pull amplifier and a transformer balun. Other components such as a number of SMT (surface-mount technology) devices (314) and an antenna switch module (ASM) (312) may also be mounted on the packaging substrate (302). Although all of the various components are depicted as being laid out on the packaging substrate (302), it will be understood that some component(s) can be implemented over other component(s).

In some implementations, a device and/or a circuit having one or more features described herein may be included in an RF device such as a wireless device. Such a device and/or a circuit may be implemented directly in the wireless device, in a modular form as described herein, or in some combination thereof. Such a wireless device may include, for example, a cellular phone, a smart-phone, a hand-held wireless device with or without phone functionality, a wireless tablet, etc.

Figure 12:
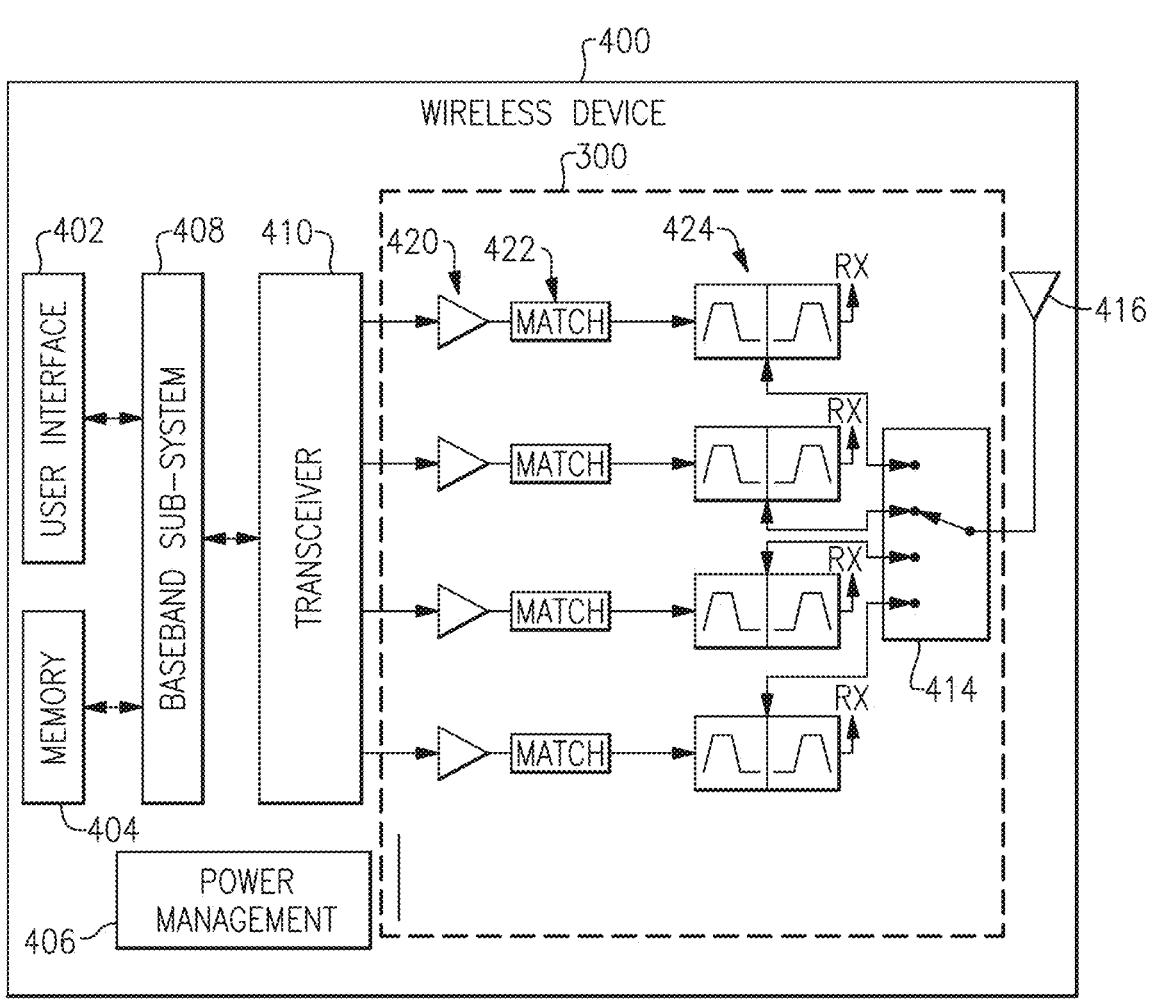
FIG. 12 illustrates an example wireless device according to an embodiment.

FIG. 12 illustrates an example wireless device (400) having one or more advantageous features described herein. In the context of a module having one or more features as described herein, such a module may be generally depicted by a dashed box 300, and can be implemented as, for example, a front-end module (FEM).

Referring to FIG. 12, power amplifiers (PAs) (420) may receive their respective RF signals from a transceiver (410) that can be configured and operated in known manners to generate RF signals to be amplified and transmitted, and to process received signals. The transceiver (410) may interact with a baseband sub-system (408) that is configured to provide conversion between data and/or voice signals suitable for a user and RF signals suitable for the transceiver (410). The transceiver (410) can also be in communication with a power management component (406) that is configured to manage power for the operation of the wireless device (400). Such power management can also control operations of the baseband sub-system (408) and the module (300). The baseband sub-system (408) may be connected to a user interface (402) to facilitate various input and output of voice and/or data provided to and received from the user. The baseband sub-system (408) may also be connected to a memory (404) that is configured to store data and/or instructions to facilitate the operation of the wireless device, and/or to provide storage of information for the user.

In the example wireless device (400) shown in FIG. 12, outputs of the PAs (420) may be matched via respective match circuits (422) and routed to their respective duplexers (424). Such amplified and filtered signals may be routed to an antenna (416) through an antenna switch (414) for transmission. Optionally, the duplexers (424) may allow transmit and receive operations to be performed simultaneously using a common antenna (416). Received signals may be routed to "Rx" paths that may comprise, for example, a low-noise amplifier (LNA).

A number of other wireless device configurations may utilize one or more features described herein. For example, a wireless device does not need to be a multi-band device. In another example, a wireless device may include additional antennas such as diversity antenna, and additional connectivity features such as Wi-Fi, Bluetooth, and GPS.

As described herein, one or more features of the present disclosure may provide a number of advantages when implemented in systems such as those involving the wireless device of FIG. 12. For example, the disclosed architecture may greatly improve the usable bandwidth of a push-pull amplifier.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:
a power amplifier circuit, the power amplifier circuit including at least two differential transistors and at least one capacitor connected to the at least two differential transistors; and
a frequency response compensation circuit for providing a plurality of values of capacitance, the frequency response compensation circuit including at least one tuning capacitor coupled to a tuning switch to control a value of the capacitance provided by the frequency response compensation circuit, the tuning capacitor coupled in parallel with the at least one capacitor, the frequency response compensation circuit further coupled to the at least two differential transistors of the power amplifier circuit, and the frequency response compensation circuit configured to reduce variation over frequency of a load impedance of the power amplification system.

2. The power amplification system of claim 1 wherein at least one of the at least two differential transistors is a heterojunction bipolar transistor.

3. The power amplification system of claim 1 wherein the power amplifier circuit comprises a push-pull amplifier.

4. The power amplification system of claim 3 wherein the push-pull amplifier includes a transformer balun.

5. The power amplification system of claim 1 wherein the at least one capacitor connected to the differential transistors is connected to drains or collectors of two of the differential transistors.

6. The power amplification system of claim 1 wherein the frequency response compensation circuit is coupled to a collector of at least one of the at least two the differential transistors.

7. The power amplification system of claim 1 wherein the frequency response compensation circuit is couple to an an emitter of at least one of the at least two the differential transistors.

8. The power amplification system of claim 1 wherein a capacitance of the power amplifier circuit is dependent on one or more of: a value of the at least one capacitor connected to the at least two differential transistors, a value of the capacitance provided by the frequency response compensation circuit, whether the at least one capacitor connected to the at least two differential transistors and the frequency response compensation circuit is connected in parallel or in series, and whether the tuning switch is on or off.

9. The power amplification system of claim 1 wherein the frequency response compensation circuit provides low capacitance having a value close to zero when the tuning switch is off.

10. The power amplification system of claim 1 wherein, when the tuning switch is off, the frequency response compensation circuit does not provide additional capacitance to the power amplifier circuit, and the power amplifier circuit has an impedance value that is suitable for operation at a higher frequency band.

11. The power amplification system of claim 1 wherein, when the tuning switch is on, the frequency response compensation circuit provides additional capacitance to the power amplifier circuit that causes an on-resistance of the tuning switch at a lower frequency band to decrease and power-added efficiency of the power amplification system at the lower frequency band to increase.

12. The power amplification system of claim 1 wherein the tuning switch of the frequency response compensation circuit enables control of the capacitance of the amplifier circuit.

13. The power amplification system of claim 1 wherein the frequency response compensation circuit is configured to improve the power-added efficiency of the power amplification system.

14. The power amplification system of claim 1 wherein the tuning switch is a FET switch.

15. The power amplification system of claim 1 wherein the power amplification system comprises and/or is connected to one or more power amplifier components configured to provide at least one of advanced power tracking and envelop tracking.

16. The power amplification system of claim 1 wherein one or more parts of the frequency response compensation circuit are controlled by a CMOS control, the CMOS control being configured receive band and/or power mode controls over a MIPI digital interface.

17. The power amplification system of claim 1 comprising an output power control circuit for providing a plurality of values of capacitance, the output power control circuit having at least one load control capacitor coupled to a load control switch to control the value of the capacitance provided by the output power control circuit, and a balun coupled to the power amplifier circuit and to the output power control circuit.

18. The power amplification system of claim 1 wherein at least one of the at least two transistors is a heterojunction bipolar transistor.

19. A wireless device comprising:
a memory;
a user interface;
a baseband sub-system;
a transceiver;
a power management component; and
a power amplification system, the power amplification system including a power amplifier circuit having at least two differential transistors and at least one capacitor connected to the at least two differential transistors and a frequency response compensation circuit for providing a plurality of values of capacitance, the frequency response compensation circuit having at least one tuning capacitor coupled in parallel with the at least one capacitor and to a tuning switch to control a value of the capacitance provided by the frequency response compensation circuit, the frequency response compensation circuit further coupled to the at least two differential transistors of the power amplifier circuit, and the frequency response compensation circuit configured to reduce variation over frequency of a load impedance of the power amplification system.

20. A wireless module comprising:
a packaging substrate;
one or more surface-mount devices;
a duplexer assembly;
a front-end power management integrated circuit;
a match component;
an antenna switch module; and
a power amplifier assembly including a power amplification system, the power amplification system having a power amplifier circuit, the power amplifier circuit including at least two differential transistors and at least one capacitor connected to the at least two differential transistors, a frequency response compensation circuit for providing a plurality of values of capacitance, the frequency response compensation circuit having at least one tuning capacitor coupled in parallel with the at least one capacitor and to a tuning switch to control a value of the capacitance provided by the frequency response compensation circuit, the frequency response compensation circuit further coupled to the at least two differential transistors of the power amplifier circuit, and the frequency response compensation circuit being configured to reduce variation over frequency of a load impedance of the power amplification system.

* * * * *